(12) United States Patent
Sinha et al.

(10) Patent No.: US 11,211,262 B2
(45) Date of Patent: Dec. 28, 2021

(54) ELECTRONIC APPARATUS HAVING INTER-CHIP STIFFENER

(71) Applicant: INTERNATIONAL BUSINESS MACHINES CORPORATION, Armonk, NY (US)

(72) Inventors: Tuhin Sinha, Oradell, NJ (US); Steven P. Ostrander, Poughkeepsie, NY (US); Bhupender Singh, Fishkill, NY (US); Sylvain Ouimet, St-Hubert (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/745,278

(22) Filed: Jan. 16, 2020

(65) Prior Publication Data

US 2021/0225665 A1 Jul. 22, 2021

(51) Int. Cl.
  *H01L 23/16* (2006.01)
  *H01L 21/56* (2006.01)
  *H01L 23/31* (2006.01)
  *G11C 11/407* (2006.01)
  *H01L 23/04* (2006.01)

(52) U.S. Cl.
  CPC ........ *H01L 21/563* (2013.01); *H01L 23/3128* (2013.01); *G11C 11/407* (2013.01); *H01L 23/04* (2013.01); *H01L 23/16* (2013.01); *H01L 2924/10253* (2013.01)

(58) Field of Classification Search
  None
  See application file for complete search history.

(56) References Cited

U.S. PATENT DOCUMENTS

| | | | |
|---|---|---|---|
| 6,528,892 B2 | 3/2003 | Caletka et al. | |
| 9,089,052 B2 * | 7/2015 | Li | H05K 1/0204 |
| 9,478,504 B1 | 10/2016 | Shen et al. | |
| 2008/0128897 A1 | 6/2008 | Chao | |
| 2009/0057884 A1 | 3/2009 | Too et al. | |
| 2010/0181665 A1 * | 7/2010 | Casey | H01L 23/04 |
| | | | 257/723 |
| 2012/0188721 A1 | 7/2012 | Ho et al. | |
| 2014/0048326 A1 | 2/2014 | Lin et al. | |
| 2016/0095209 A1 | 3/2016 | Starkston et al. | |
| 2016/0172313 A1 | 6/2016 | Zhu | |
| 2016/0172323 A1 * | 6/2016 | Tomita | H01L 23/5385 |
| | | | 257/774 |
| 2018/0138151 A1 * | 5/2018 | Shih | H01L 24/94 |
| 2018/0174865 A1 * | 6/2018 | Yu | H01L 21/568 |
| 2019/0115272 A1 * | 4/2019 | Yu | H01L 24/14 |
| 2019/0164806 A1 * | 5/2019 | Leobandung | H01L 23/5385 |

* cited by examiner

*Primary Examiner* — Marcos D. Pizarro
*Assistant Examiner* — William H Anderson
(74) *Attorney, Agent, or Firm* — L. Jeffrey Kelly

(57) ABSTRACT

An electronic apparatus that includes a first semiconductor chip mounted on a substrate; a second semiconductor chip mounted on the substrate; a spacer attached to the substrate and situated between the first and second semiconductor chips; a lid mounted on the substrate and enclosing the first and second semiconductor chips and the spacer, the spacer having an adhesive material adhesively attached to the lid; and underfill material underneath the first and second semiconductor chips, underneath the spacer and between the spacer and the first and second semiconductor chips.

19 Claims, 4 Drawing Sheets

ELECTRONIC APPARATUS HAVING INTER-CHIP STIFFENER

BACKGROUND

The present exemplary embodiments pertain to an electronic apparatus having thermo-mechanical stability in multi-chip modules and, more particularly, pertain to an electronic apparatus having a silicon spacer acting as a stiffener between two semiconductor chips.

Organic flip-chip packages may warp due to coefficient of thermal expansion mismatch between the silicon semiconductor chip and the organic substrate. Warpage behavior for semiconductor chip modules is getting complex with the introduction of Heterogeneously Integrated (HI) components such as Dual chip modules, Multi-chip modules, Chip-scale packages, Silicon bridges, etc. Heterogeneously Integrated means having components of different sizes, thicknesses and types on the same organic substrate.

Warpage control is critical during bond and assembly as is thermal and mechanical reliability. Warpage control becomes increasingly difficult with the introduction of HI and multi-chip modules.

BRIEF SUMMARY

The various advantages and purposes of the exemplary embodiments as described above and hereafter are achieved by providing, according to an aspect of the exemplary embodiments, an electronic apparatus comprising: a first semiconductor chip mounted on a substrate; a second semiconductor chip mounted on the substrate; a spacer attached to the substrate and situated between the first and second semiconductor chips; a lid mounted on the substrate and enclosing the first and second semiconductor chips and the spacer, the spacer having an adhesive material adhesively attached to the lid; and underfill material underneath the first and second semiconductor chips, underneath the spacer and between the spacer and the first and second semiconductor chips.

According to another aspect of the exemplary embodiments, there is provided an electronic apparatus comprising: a first semiconductor chip attached to a substrate; a second semiconductor chip attached to the substrate; a silicon spacer attached to the substrate and situated between the first and second semiconductor chips, the silicon spacer attached to the substrate by the same means as the first and second semiconductor chips are attached to the substrate and the silicon spacer is spaced 50 to 100 microns from each of the first and second semiconductor chips; a lid mounted on the substrate and enclosing the first and second semiconductor chips and the silicon spacer, the spacer having an adhesive material adhesively attached to the lid; and underfill material underneath the first and second semiconductor chips, underneath the silicon spacer and between the silicon spacer and the first and second semiconductor chips According to a further aspect of the exemplary embodiments, there is provided a method of reducing warpage of organic substrates comprising: placing a first semiconductor chip on the organic substrate; placing a second semiconductor chip on the organic substrate; placing a silicon spacer between the first and second semiconductor chips on the organic substrate, the silicon spacer being spaced 50 to 100 microns from each of the first and second semiconductor chips and the silicon spacer having an adhesive material on an end of the silicon spacer away from the organic substrate; heating the first semiconductor chip, second semiconductor chip and the silicon spacer to cause bonding with the organic substrate; underfilling material underneath the first and second semiconductor chips, underneath the silicon spacer and between the silicon spacer and the first and second semiconductor chips; and mounting a lid on the substrate and enclosing the first and second semiconductor chips and the silicon spacer, the adhesive material on the silicon spacer adhesively joining with the lid.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

Figure 1:
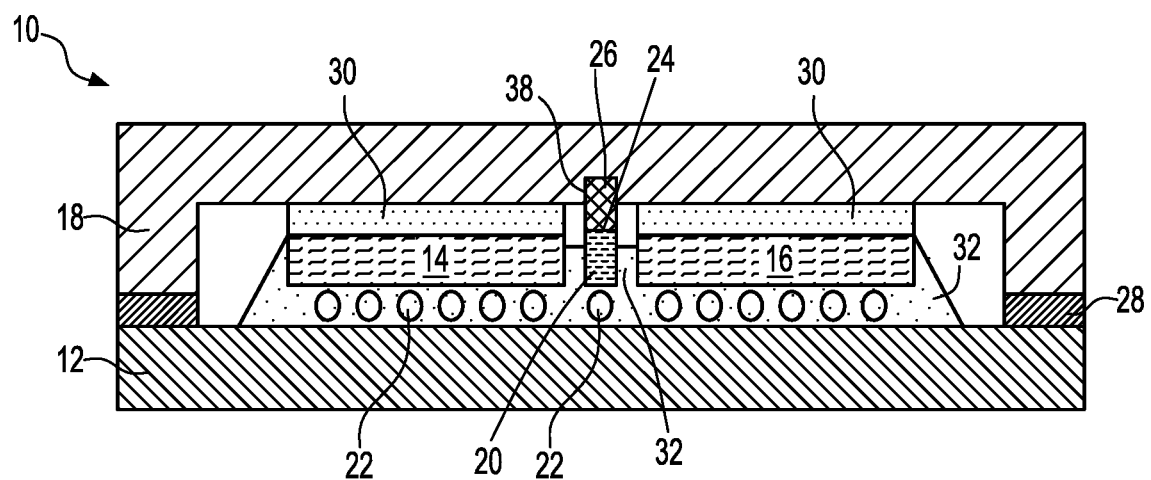
FIG. 1 is a partial cross sectional view of an exemplary embodiment of an electronic apparatus having a silicon spacer between adjacent semiconductor chips.

Referring to the Figures in more detail, and particularly referring to FIG. 1, there is disclosed an exemplary embodiment of an electronic apparatus 10 which includes an organic substrate 12, a first semiconductor chip 14, a second semiconductor chip 16 and a lid 18 enclosing the first and second semiconductor chips 14, 16. The lid 18 would normally entirely enclose the first and second semiconductor chips 14, 16 so the lid 18 and organic substrate 12 are shown in cross section to show the first and second semiconductor chips 14, 16. While FIG. 1 shows two semiconductor chips 14, 16, it should be understood that there may be more than two semiconductor chips 14, 16, as further illustrated in FIGS. 4 and 5.

Also shown in FIG. 1 is a silicon spacer 20 which acts as a stiffener. The silicon spacer 20 is placed between the first semiconductor chip 14 and the second semiconductor chip 16.

Silicon is the preferred material for the spacer as silicon enables use of existing attachment methods to the organic substrate 12 such as solder balls that are in a typical semiconductor fabrication facility.

Furthermore, using silicon as the spacer enables the use of other processes in the typical semiconductor fabrication facility like dicing and grinding to control the dimensions of the spacer.

Other possible materials for the spacer in lieu of silicon may be glass or copper with a passivation material on which solder balls may be deposited.

Figure 1A:
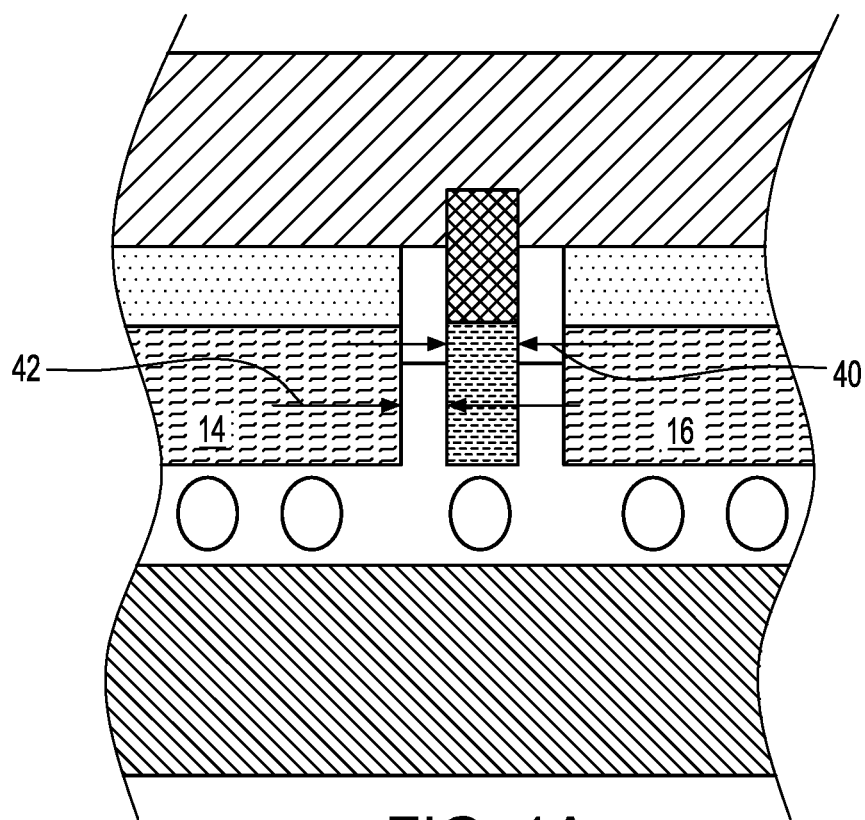
FIG. 1A is an enlarged partial cross sectional view of the exemplary embodiment of FIG. 1.
Figure 2:
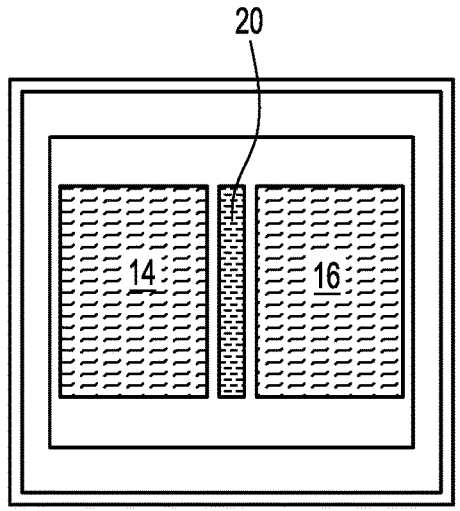
FIG. 2 is a plan view with the lid removed of the electronic apparatus of FIG. 1 with two semiconductor chips of the same size and the silicon spacer positioned between the semiconductor chips.

The silicon spacer 20 is thin so as to not adversely affect the separation distance between the first semiconductor chip 14 and the second semiconductor chip 16. Referring now to FIG. 1A, by thin, it is meant that the silicon spacer 20 is about 0.5 millimeters to 1.0 millimeters in thickness. The thickness of silicon spacer 20 is represented by arrows 40. As will be illustrated hereafter, the silicon spacer 20 may extend entirely or partially between the first semiconductor chip 14 and the second semiconductor chip 16 or other semiconductor chips that may be present. Further, the gap spacing 42 between the silicon spacer 20 and each of the first semiconductor chip 14 and the second semiconductor chip 16 is about 50 to 100 microns.

Each of the first semiconductor chip 14 and the second semiconductor chip 16 and the silicon spacer 20 may be attached to the organic substrate 12 by solder balls 22.

Attaching the silicon spacer 20 by solder balls 22 is preferred as it enables connecting both semiconductor chips 14, 16 and silicon spacer 20 in one single reflow process. Adhesives may be used in place of solder balls but will require a secondary curing process. Room temperature UV curable adhesives may help in removing the necessity for a secondary curing process but their reliability performance may be inferior compared to traditional bond and assembly methods using solder balls.

An end 24 of the silicon spacer 20 may be attached to the lid 18 by an adhesive material 26. The lid 18 may be attached to the organic substrate 12 by a sealband adhesive 28.

Further included within the electronic apparatus 10 may be a thermal interface material (TIM) 30 which is a good heat transfer medium to allow heat from the first semiconductor chip 14 and the second semiconductor chip 16 to pass into the lid 18. Also included in the electronic apparatus 10 is an underfill material 32, such as an epoxy. The gap spacing 42 of 50 to 100 microns between the silicon spacer 20 and the first semiconductor chip 14 and the second semiconductor chip 16 is sufficient to allow flow of the underfill 32 into the gap spacing 42.

Not shown in FIG. 1 or any of the other exemplary embodiments is a heat sink that optionally may be placed on the lid 18.

The exemplary embodiments offer several advantages. Due to the small size of the silicon spacer 20, chip to chip spacing may be reduced significantly. Smaller chip to chip spacing improves electrical performance of the electronic apparatus 10

With the addition of the silicon spacer 20, the entire structure acts as one large single chip module and hence, TIM tearing risk in the inner chip corners drops down significantly.

Other advantages are that the design of the lid 18 is simplified and module weight is reduced considerably due to the simplified design of the lid 18.

FIGS. 2 to 5 illustrate plan views of exemplary configurations of the silicon spacer 20 and adjacent semiconductor chips with the lid 18 removed. It should be understood that the configurations shown in FIGS. 2 to 5 are only illustrative of various configurations of the silicon spacer 20 and adjacent semiconductor chips and are not meant to be limiting as to the possibility and likelihood of other configurations In FIG. 2, the two semiconductor chips 14, 16 are of approximate equal size and the length of the silicon spacer 20 may extend the entire length of each of the semiconductor chips 14, 16. It is preferred that the silicon spacer 20 extend to the longest length possible, in this case extending to the entire length of each of the semiconductor chips 14, 16, if it is permissible by other top side components. A smaller spacer may be used if the laminate top side real estate is scarce and is pre-occupied by active elements such as capacitors, memory, etc.

Figure 3:
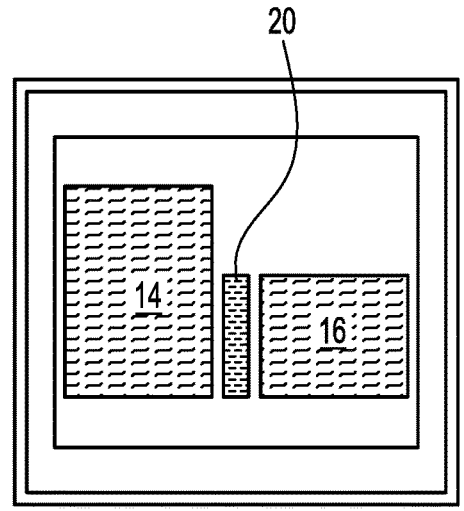
FIG. 3 is a plan view with the lid removed of the electronic apparatus of FIG. 1 with two semiconductor chips of different sizes and the silicon spacer positioned between the semiconductor chips.

In FIG. 3, one semiconductor chip 14 may be larger than semiconductor chip 16. In this instance, the length of the silicon spacer 20 may only extend the length of the smaller semiconductor chip, in this case semiconductor chip 16.

Figure 4:
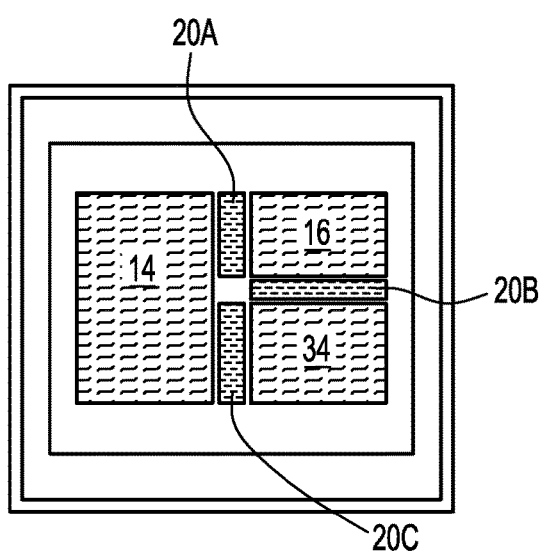
FIG. 4 is a plan view with the lid removed of the electronic apparatus of FIG. 1 with three semiconductor chips of different sizes and the silicon spacer positioned between each pair of the semiconductor chips.

In FIG. 4, there are illustrated three semiconductor chips 14, 16, 34 with corresponding silicon spacers 20A, 20B, 20C between them. Each of the semiconductor chips 14, 16, 34 may be of different size as may be the case with an HI electronic apparatus. Silicon spacer 20A may be placed between semiconductor chips 14, 16 and have a length that extends the width of semiconductor chip 16. Silicon spacer 20B may be placed between semiconductor chips 16, 34 and have a length that extends the length of semiconductor chips 16, 34. Silicon spacer 20C may be placed between semiconductor chips 14, 34 and have a length that extends the width of semiconductor chip 34.

Figure 5:
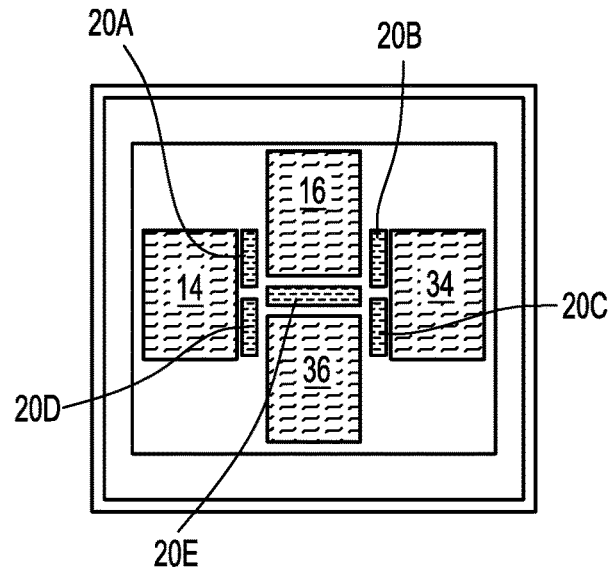
FIG. 5 is a plan view with the lid removed of the electronic apparatus of FIG. 1 with four semiconductor chips of the same size and the silicon spacer positioned between each pair of the semiconductor chips.

In FIG. 5, there are illustrated four semiconductor chips 14, 16, 34, 36 with corresponding silicon spacers 20A, 20B, 20C, 20D, 20E between them. Each of the semiconductor chips 14, 16, 34, 36 may be of a different size as may be the case with an HI electronic apparatus but as shown in FIG. 5, all of the semiconductor chips 14, 16, 34, 36 are of the same size. Silicon spacer 20A may be placed between semiconductor chips 14, 16 and have a length that partially extends the length of each of the semiconductor chips 14, 16. Silicon spacer 20B may be placed between semiconductor chips 16, 34 and have a length that partially extends the length of each of the semiconductor chips 16, 34. Silicon spacer 20C may be placed between semiconductor chips 34, 36 and have a length that partially extends the length of each of the semiconductor chips 34, 36. Silicon spacer 20D may be placed between semiconductor chips 14, 36 and have a length that partially extends the length of each of the semiconductor chips 14, 36. Silicon spacer 20E may be placed between semiconductor chips 16, 36 and have a length that extends to the width of semiconductor chips 16, 36

For consistency, in plan view, the "length" of the silicon spacer is defined as the longest dimension of the silicon spacer while the "width" of the silicon spacer is defined as the shortest dimension of the silicon spacer. Similarly, in plan view, the "length" of the semiconductor chip is defined as the longest dimension of the semiconductor chip while the "width" of the semiconductor chip is defined as the shortest dimension of the semiconductor chip. For a square semiconductor chip or silicon spacer, "length" and "width" are interchangeable.

Referring back to FIG. 1, the lid 18 of the electronic apparatus 10 may have a notch 38 to receive the adhesive 26 of the silicon spacer 20. The notch 38 would extend to the full length of the silicon spacer 20. In one exemplary embodiment, only the adhesive 26 would fit within notch 38. In another exemplary embodiment, a portion of the silicon spacer 20 plus the adhesive 26 would fit within notch 38

The adhesive 26, as shown in FIG. 1, may be the same as the sealband adhesive 28. In addition, the silicon spacer 20 may have a height that is the same as that of one or more of the semiconductor chips 14, 16.

Referring now to FIGS. 6 to 10, there are shown variations of the electronic apparatus 10 illustrated in FIG. 1. It should be understood that the variations shown in FIGS. 6 to 10 are only illustrative of some variations of the electronic apparatus 10 and are not meant to be limiting as to the possibility and likelihood of other variations.

Figure 6:
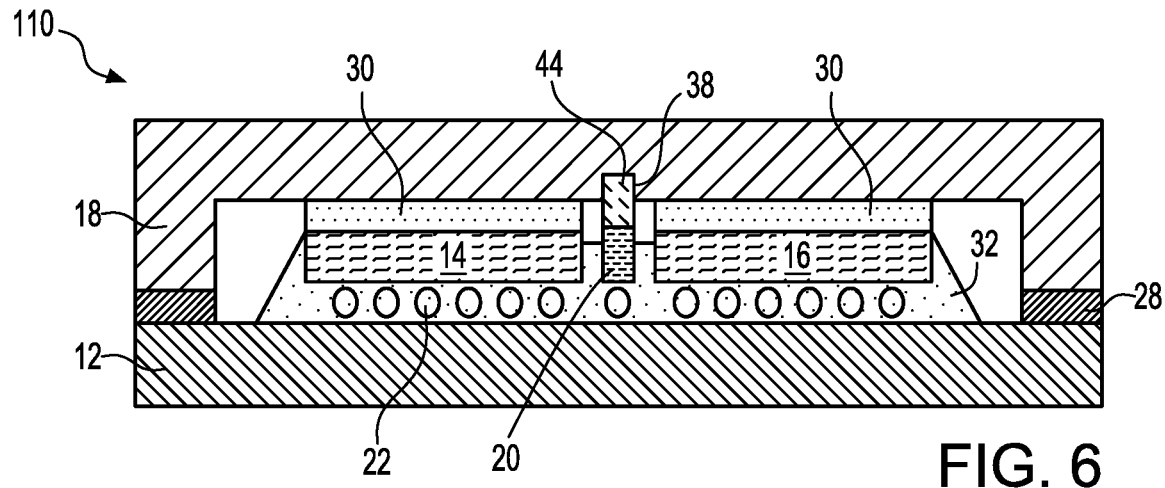
FIG. 6 is a partial cross sectional view of an exemplary embodiment of an electronic apparatus having a silicon spacer between adjacent semiconductor chips similar to the exemplary embodiment in FIG. 1 and in which the silicon spacer is attached to the lid by a high strength adhesive.

The electronic apparatus 110 shown in FIG. 6 is similar to the electronic apparatus 10 illustrated in FIG. 1 except that the adhesive 44 to attach the silicon spacer 20 to the lid 18 is a high strength adhesive. The exemplary embodiment of the electronic apparatus 110 is the most preferred embodiment because of the high strength adhesive 44 and the notch 38 in the lid 18 which results in enhanced attachment of the silicon spacer 20 to the lid 18.

There are at least two types of adhesives that may be used in the exemplary embodiments. One type of adhesive is a low strength adhesive and is typically used for the sealband adhesive 28. In the exemplary embodiments, a low strength adhesive may also be used for adhesive 26 in the electronic apparatus 10 in FIG. 1. In other of the exemplary embodiments, a high strength adhesive may be used such as for adhesive 44 in the electronic apparatus 110 in FIG. 6. A low strength adhesive may have a modulus of 7 to 10 megapascals. A commercial example of a low strength adhesive is Shinetsu EA6700S. A high strength adhesive may have a modulus of 9,000 to 10,000 megapascals. Commercial examples of a high strength adhesive are LOCTITE ABLESTIK 965-1 L or Ablebond 84-3. It can be seen that the high strength adhesive has a modulus that may be hundreds of times higher than the low strength adhesive.

Figure 7:
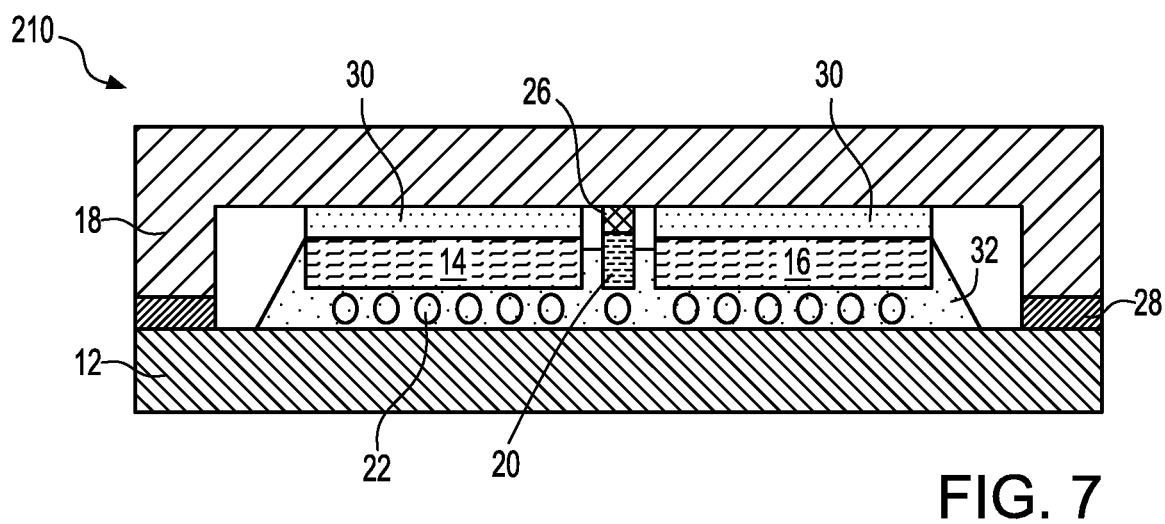
FIG. 7 is a partial cross sectional view of an exemplary embodiment of an electronic apparatus having a silicon spacer between adjacent semiconductor chips similar to the exemplary embodiment in FIG. 1 but without the notch in the lid.

The electronic apparatus 210 shown in FIG. 7 is similar to the electronic apparatus 10 illustrated in FIG. 1 except that the lid 18 does not have a notch but other elements of electronic apparatus 210 are the same as those of electronic apparatus 10.

Figure 8:
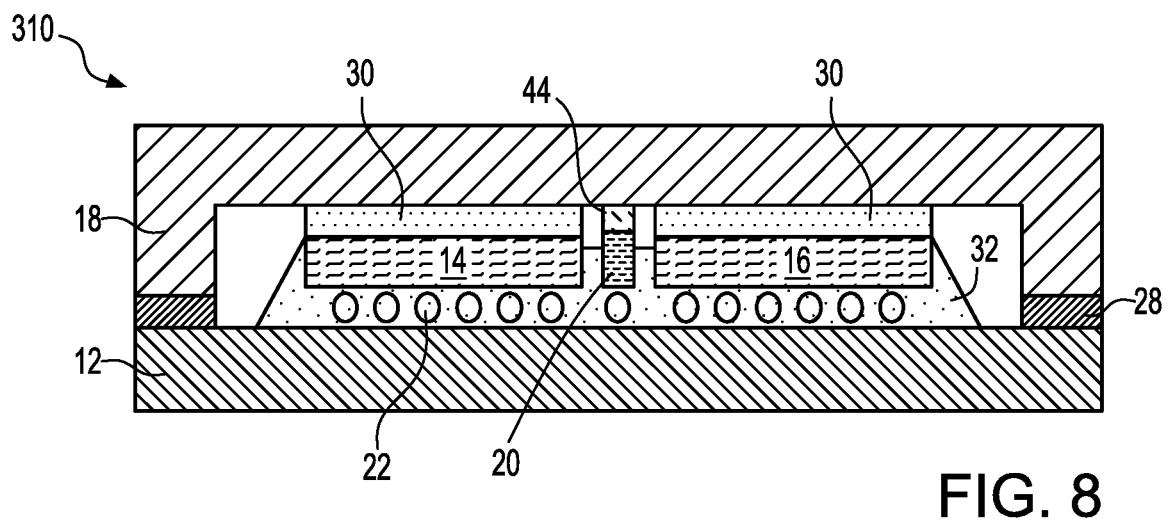
FIG. 8 is a partial cross sectional view of an exemplary embodiment of an electronic apparatus having a silicon spacer between adjacent semiconductor chips similar to the exemplary embodiment in FIG. 1 but without the notch in the lid and in which the silicon spacer is attached to the lid by a high strength adhesive.

The electronic apparatus 310 shown in FIG. 8 is similar to the electronic apparatus 10 illustrated in FIG. 1 except that the lid 18 does not have a notch and the adhesive 44 is a high strength adhesive but other elements of electronic apparatus 310 are the same as those of electronic apparatus 10.

Figure 9:
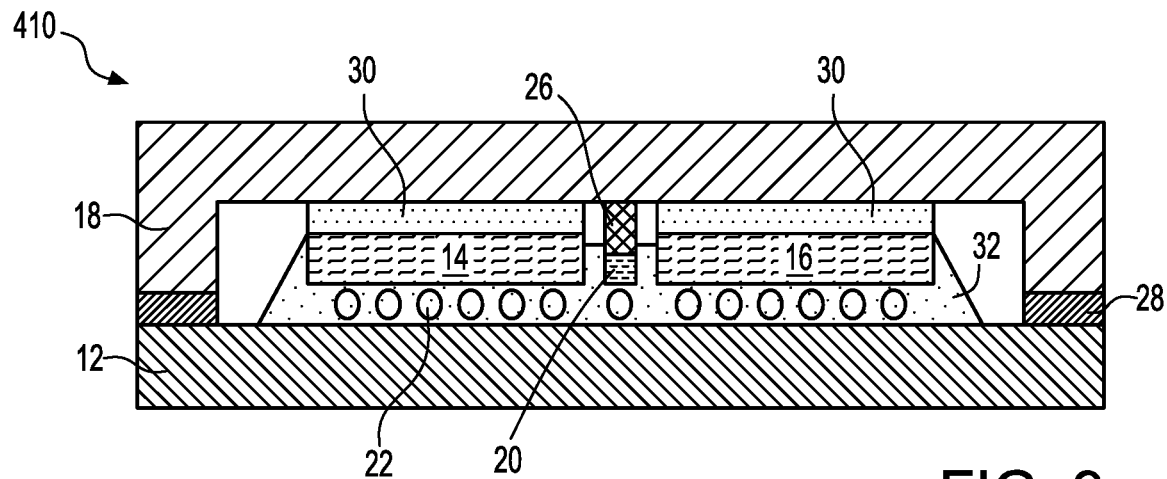
FIG. 9 is a partial cross sectional view of an exemplary embodiment of an electronic apparatus having a silicon spacer between adjacent semiconductor chips similar to the exemplary embodiment in FIG. 1 but without the notch in the lid and the silicon stiffener has a different height than the semiconductor chips.

The electronic apparatus 410 shown in FIG. 9 is similar to the electronic apparatus 10 illustrated in FIG. 1 except that the lid 18 does not have a notch and the silicon stiffener 20 has a different height than the semiconductor chips 14, 16 but other elements of electronic apparatus 410 are the same as those of electronic apparatus 10. The different height in FIG. 9 is less than the height of the semiconductor chips 14, 16 but in other embodiments, the height may be greater than the height of the semiconductor chips 14, 16.

Figure 10:
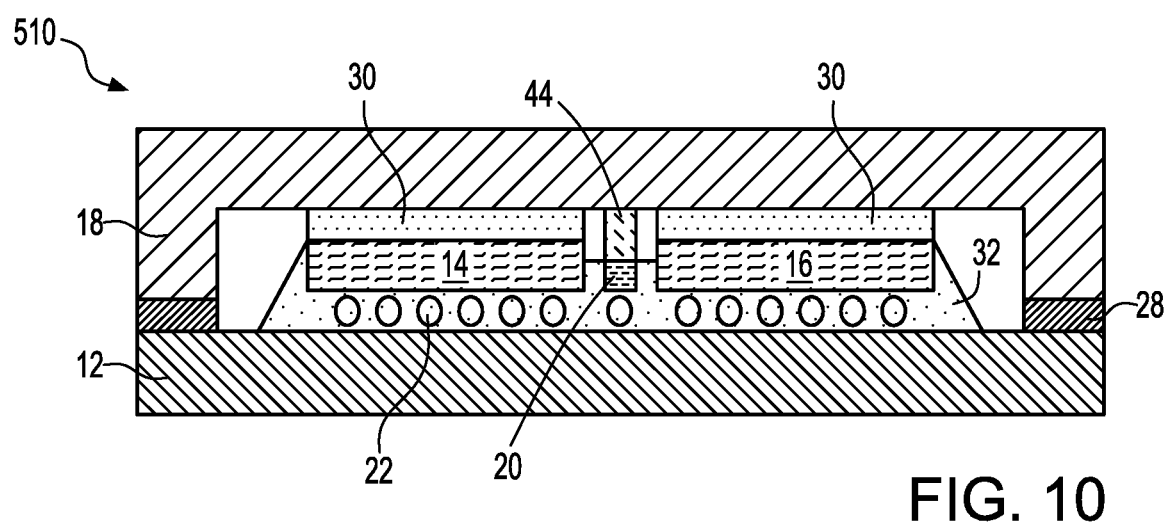
FIG. 10 is a partial cross sectional view of an exemplary embodiment of an electronic apparatus having a silicon spacer between adjacent semiconductor chips similar to the exemplary embodiment in FIG. 1 but without the notch in the lid, the silicon stiffener has a different height than the semiconductor chips and the silicon spacer is attached to the lid by a high strength adhesive.

The electronic apparatus 510 shown in FIG. 10 is similar to the electronic apparatus 10 illustrated in FIG. 1 except that the lid 18 does not have a notch, the adhesive 44 is a high strength adhesive and the silicon stiffener 20 has a different height than the semiconductor chips 14, 16 but other elements of electronic apparatus 210 are the same as those of electronic apparatus 10. The different height in FIG. 10 is less than the height of the semiconductor chips 14, 16 but in other embodiments, the height may be greater than the height of the semiconductor chips 14, 16.

Figure 11:
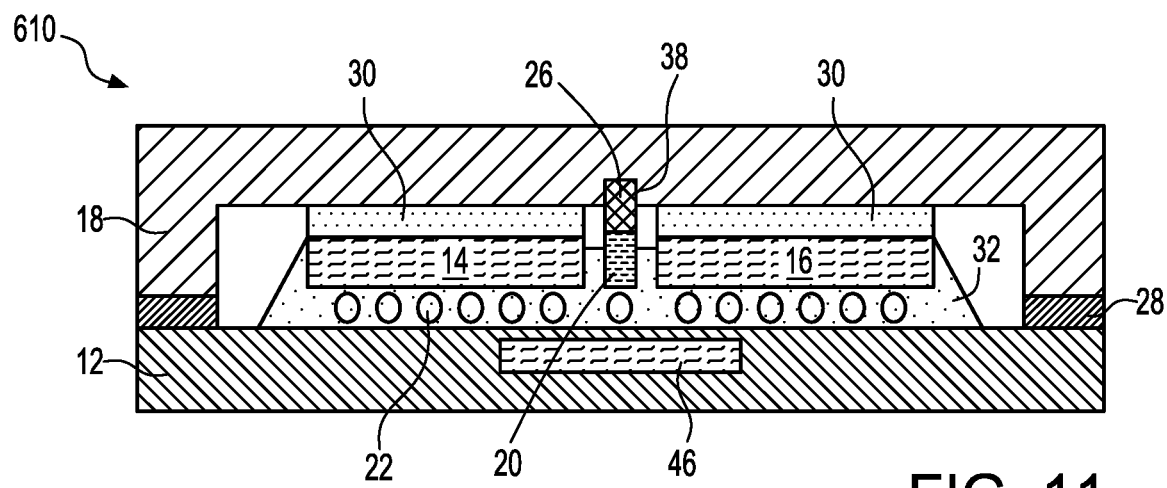
FIG. 11 is a partial cross sectional view of an exemplary embodiment of an electronic apparatus having a silicon spacer between adjacent semiconductor chips similar to the exemplary embodiment in FIG. 1 except that the electronic apparatus in FIG. 11 includes a bridge embedded in the organic substrate to electrically connect the semiconductor chips.

Referring now to FIG. 11, disclosed is another exemplary embodiment of an electronic apparatus 610. Electronic apparatus 610 is similar to electronic apparatus 10 illustrated in FIG. 1 except that electronic apparatus 610 includes a bridge 46 embedded in the organic substrate 12. The bridge 46, preferably made from a semiconductor material, electrically connects semiconductor chip 14 to semiconductor chip 16. In order to enable fast communication between the semiconductor chips 14, 16, wiring dimensions in the bridge 46 that are achievable in semiconductor fabrication are preferred over the larger and slower wiring dimensions of an organic substrate.

While the bridge 46 is only shown in exemplary embodiment 610 similar to electronic apparatus 10, it is within the scope of the invention to modify any of the electronic apparatuses 110, 210, 310, 410, 510 illustrated in FIGS. 6 to 10 by embedding a bridge 46 in the organic substrate 12 to enable fast communication via the bridge 46 between the various semiconductor devices.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:
1. An electronic apparatus comprising:
a first semiconductor chip mounted on a substrate;
a second semiconductor chip mounted on the substrate;
a spacer attached to the substrate and situated between the first and second semiconductor chips, a height of the spacer being equal to a height of the first semiconductor chip and the second semiconductor chip;

a lid enclosing the first semiconductor chip, the second semiconductor chip, and the spacer, the lid having a notch facing the spacer;

an adhesive material filling the notch and adhesively coupling the lid to a top of the spacer; and an underfill material underneath the first and second semiconductor chips, underneath the spacer and between the spacer and the first and second semiconductor chips.

2. The electronic apparatus of claim 1, wherein the spacer is a silicon spacer and the silicon spacer has no electrical function.

3. The electronic apparatus of claim 1, wherein the spacer is spaced 50 to 100 microns from each of the first and second semiconductor chips.

4. The electronic apparatus of claim 1, wherein the spacer has a thickness of 0.5 to 1.0 millimeters and a length corresponding to a width of a smallest of the first and second semiconductor chips.

5. The electronic apparatus of claim 1, further comprising:

a silicon bridge embedded in the substrate to electrically connect the first and second semiconductor chips.

6. The electronic apparatus of claim 1, further comprising:

a third semiconductor chip mounted on the substrate and a second spacer attached to the substrate and situated between one of the first and second semiconductor chips and the third semiconductor chip.

7. The electronic apparatus of claim 6, wherein both the spacer and the second spacer are silicon and have no electrical function.

8. The electronic apparatus of claim 1, wherein the adhesive material comprises a Youngs modulus at least 1/100 that of a high strength adhesive material with a Youngs modulus ranging from 9,000 to 10,000 megapascals.

9. The electronic apparatus of claim 1, wherein the adhesive material comprises a Youngs modulus at least 100 times that of a low strength adhesive material with a Youngs modulus ranging from 7 to 10 megapascals.

10. An electronic apparatus comprising:

a first semiconductor chip attached to a substrate;

a second semiconductor chip attached to the substrate;

a silicon spacer attached to the substrate and situated between the first and second semiconductor chips, the silicon spacer attached to the substrate by the same means as the first and second semiconductor chips are attached to the substrate and the silicon spacer is spaced 50 to 100 microns from each of the first and second semiconductor chips;

a lid enclosing the first semiconductor chip, the second semiconductor chip, and the spacer, the lid having a notch facing the spacer;

an adhesive material filling the notch and adhesively coupling a top of the spacer to the lid; and an underfill material underneath the first and second semiconductor chips, underneath the silicon spacer and between the silicon spacer and the first and second semiconductor chips.

11. The electronic apparatus of claim 10, wherein the silicon spacer has a thickness of 0.5 to 1.0 millimeters and a length corresponding to a width of a smallest of the first and second semiconductor chips.

12. The electronic apparatus of claim 10, wherein the silicon spacer has no electrical function, and wherein the adhesive material comprises a Youngs modulus at least 100 times that of a low strength adhesive material with a Youngs modulus ranging from 7 to 10 megapascals.

13. The electronic apparatus of claim 10, further comprising:

a silicon bridge embedded in the substrate electrically connecting the first and second semiconductor chips.

14. An electronic apparatus comprising:

a first semiconductor chip mounted on a substrate;

a second semiconductor chip mounted on the substrate;

a third semiconductor chip mounted on the substrate;

a first spacer attached to the substrate and situated between the first semiconductor chip and the second semiconductor chip;

a second spacer attached to the substrate and situated between the third semiconductor chip and one of the first semiconductor chip and the second semiconductor chip;

a lid enclosing the first semiconductor chip, the second semiconductor chip, the third semiconductor chip, the first spacer, and the second spacer, wherein the lid comprises a first notch extending an entire length of the first spacer, and a second notch extending an entire length of the second spacer; and an adhesive material filling the first notch, filling the second notch, and joining top surfaces of the first spacer and the second spacer with the lid.

15. The electronic apparatus of claim 14, wherein both the first spacer and the second spacer are made of silicon and have no electrical function.

16. The electronic apparatus of claim 14, wherein the first spacer is laterally spaced 50 microns to 100 microns from each of the first semiconductor chip and the second semiconductor chip.

17. The electronic apparatus of claim 14, wherein the first spacer has a thickness of 0.5 to 1.0 millimeters and a length corresponding to a width of a smallest of the first semiconductor chip and the second semiconductor chip.

18. The electronic apparatus of claim 14, further comprising:

a silicon bridge embedded in the substrate to electrically connect the first semiconductor chip and the second semiconductor chip.

19. The electronic apparatus of claim 14, wherein the adhesive material comprising a Youngs modulus at least 100 times that of a low strength adhesive material with a Youngs modulus ranging from 7 to 10 megapascals.

* * * * *